(12) United States Patent
Nakagawa

(10) Patent No.: US 7,501,294 B1
(45) Date of Patent: Mar. 10, 2009

(54) VCSEL FOR HIGH SPEED LOWER POWER OPTICAL LINK

(75) Inventor: Shigeru Nakagawa, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/032,854

(22) Filed: Feb. 18, 2008

(51) Int. Cl.
*H01L 21/20* (2006.01)

(52) U.S. Cl. .......................................... 438/22; 438/46

(58) Field of Classification Search ............. 438/22–47, 438/478, 481, 483
See application file for complete search history.

(56) References Cited

U.S. PATENT DOCUMENTS

| | | | |
|---|---|---|---|
| 6,765,238 B2* | 7/2004 | Chang et al. | 257/104 |
| 7,123,638 B2* | 10/2006 | Leary et al. | 372/43.01 |
| 7,136,406 B2 | 11/2006 | Ryou | |
| 7,294,868 B2* | 11/2007 | Debray et al. | 257/104 |
| 2001/0050934 A1* | 12/2001 | Choquette et al. | 372/43 |

* cited by examiner

*Primary Examiner*—Savitri Mulpuri
(74) *Attorney, Agent, or Firm*—The Law Firm of Andrea Hence Evans, LLC

(57) ABSTRACT

A method of manufacturing a coherent light generator, especially a vertical cavity surface emitting laser (VCSEL), includes a gallium based semiconductor alloy substrate, a first DBR stack over the substrate, a first n-type clad layer over the first DBR stack, an active region containing quantum wells over the first n-type clad, a tunnel junction having an n-type and a p-type material and a boundary over the active region so that there is a standing wave null at an operating wavelength at the n-type/p-type boundary in the tunnel junction, a second n-type clad layer over the tunnel junction, an oxide aperture at least partially installed in the second n-type clad layer, and the second DBR stack over the second n-type clad of the coherent light generator. The novel VCSEL provides minimized internal optical absorption and has a low electrical resistance.

1 Claim, 2 Drawing Sheets

CAVITY = 1λ = 1 wavelength

CAVITY = 1λ = 1 wavelength

VCSEL FOR HIGH SPEED LOWER POWER OPTICAL LINK

FIELD OF THE INVENTION

This invention relates to the vertical cavity surface emitting laser (VCSEL). More specifically, it relates to the VCSEL structure that realizes a low power and high speed appropriate for a high speed optical link.

BACKGROUND OF THE INVENTION

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. VCSELs include semiconductor active regions, which can be fabricated from a wide range of material systems, distributed Bragg reflector (DBR) mirrors, current confinement structures, substrates, and contacts. Some VCSELs, particularly those used at long-wavelengths, incorporate tunnel junctions. Because of their complicated structure, and because of their material requirements, VCSELs are usually grown using molecular beam epitaxy (MBE) or metal-organic chemical vapor deposition (MOCVD).

Long-wavelength and short-wavelength are relative terms that could mean many things. As it is commonly used in the field of optoelectronic telecommunication, "long-wavelength" refers to the portion of the near IR spectrum at which dispersion and loss minima for common silica optical fiber occur at 1.31 µm and 1.55 µm, respectively. On the other hand, what is termed "short-wavelength" is the band in the near IR, at 850-1000 nm. Although long-wavelength lasers are much better suited to long distance fiberoptic communication than those which emit at 850-1000 nm due to lower attenuation loss and material dispersion of a common silica fiber, the other important difference is ease of manufacture: short-wavelength VCSELs can be fabricated entirely in the mature GaAs-AlGaAs material system and have been successfully commercialized. Long-wavelength VCSELs require newer materials and/or more complicated structures mainly lack of optimum material systems providing high DBR mirror reflectivity and high material gain at the same time.

FIG. 1 illustrates a typical long-wavelength VCSEL 10 having a tunnel junction. As shown, an n-doped InP substrate 12 has an n-type electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is a tunnel junction 28. Over the tunnel junction 28 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate al a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path through the insulating region 40. In operation, an external bias causes an electrical current 21 to flow from the electrical contact 26 toward the electrical 55 contact 14. The insulating region 40 and the conductive central opening 42 confine the current 21 such that the current 21 flows through the conductive central opening 42 and into the tunnel junction 28. The tunnel junction 28 converts incoming electrons into holes that are injected into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path.

Still referring to FIG. 1, the light 23 passes through the conduction layer 9, the cap layer 8, an aperture 30 in electrical contact 26, and out of the surface of the vertical cavity surface emitting laser 10. It should be understood that FIG. 1 illustrates a typical long-wavelength VCSEL having a tunnel junction, and that numerous variations are possible. For example, the dopings can be changed (say, by providing a p-type substrate), different material systems can be used, operational details can be tuned for maximum performance, and additional structures and features can be added. While generally successful, VCSELs similar to that illustrated in FIG. 1 have problems. One problem in realizing commercial quality long wavelength VCSELs, which is addressed by the tunnel junction 28, is optical loss. In long wavelength VCSELs, it is often critical to limit optical losses due to relatively low DBR mirror reflectivity and low material gain of the active region. To that end, p-doped materials, which absorb more light than n-doped materials, are replaced by n-doped materials and the tunnel junction 28. That junction converts electron currents into hole currents that are injected into the active region. That way, long wavelength VCSELs can be made with a less-absorbing n-type mirror on both the top and the bottom. Tunnel junctions used in semiconductor lasers are thin (say 10 nanometer), reversed biased structures. Such tunnel junctions are usually n++/p++ structures in which the n-region and p-region have a high doping density using a low diffusivity dopants. This enables a low voltage drop, low free carrier absorption and sufficient free carriers in the semiconductor lasers.

For the commercial short-wavelength VCSELs, a tunnel junction has been merely employed due to inherently optimum material combinations of GaAs, AlGaAs, and InGaAs for high DBR mirror reflectivity and high material gain, both of which compensates optical loss due to free-carrier optical absorption.

What is needed is a short wavelength VCSEL that realizes a high-speed optical transmitter consuming less power and that can be utilized in a high speed optical system or optical interconnect.

SUMMARY OF THE INVENTION

The present invention solves the problems of prior art methods of producing VCSEL chips. It is an objective of the present invention to provide a VCSEL design to achieve a power reduction in a high-speed optical interconnect. In order to realize a low power optical interconnect, the VCSEL according to an exemplary embodiment of the present invention for use with an optical interconnect emits larger optical modulation amplitude (OMA) at high data rate with smaller modulation current ($I_{MOD}$) and lower bias current ($I_b$). Low threshold material gain ($g_{th}$) reduces $I_b$ required for high modulation bandwidth. High differential quantum efficiency (DQE) provides larger OMA with smaller $I_{MOD}$, as well as reduces $I_b$ required for OMA. Low series resistance ($R_S$) decreases both modulation ($V_{MOD}$) and bias ($V_b$) voltages. The VCSEL with $g_{th}$<1000 cm$^{-1}$, DQE>50%, and $R_S$<100 Ω provides an optical interconnect transmitter operating at 15 Gbps with the OMA of over −1 dBm and the power dissipation of less than 10 mW. The present invention provides the design of a VCSEL which achieves $g_{th}$<1000 cm$^{-1}$, DQE>50%, and $R_S$<100 Ω. The $g_{th}$ of the VCSEL is reduced by increasing the reflectivity (R) of its distributed Bragg reflector (DBR) mirrors, although the increased R decreases the DQE. A tunnel junction enables the elimination of all p-type layers in the VCSEL except the tunnel junction itself by altering the p-layers to n-type. The same doping level results in a factor of 2 smaller free-carrier optical absorption at the wavelength of about 850-1000 nm for n-type than for p-type. High mobility of electrons, which is a factor of 21 higher than hole for GaAs, enables the reduction of the $R_S$ without increasing the doping level of the n-type. As a result, the VCSEL of the present invention comprises mostly n-type layers using a tunnel junction that realizes low optical internal loss due to free-carrier absorption and low $R_S$ simultaneously. Moreover, the doping level of the n-type layers in the VCSEL according to the present invention is reduced in order to further decrease optical absorption in it and the VCSEL still achieves lower $R_S$ compared to p-type layers.

It is another objective of the instant invention to minimize $R_S$. In order to minimize $R_S$, electrical resistance in lateral direction around an oxide aperture has to be minimized. Placing the oxide aperture in n-type clad layer enables the reduction of the lateral resistance and hence reduces the $R_S$. Conventional VCSELs have an oxide aperture in the p-type clad layer. The tunnel junction is located at lamda/4 away from the bottom of the top DBR (DBR1), so that there is no standing wave of electromagnetic field in the VCSEL at the tunnel junction and hence prevents optical absorption by the highly-doped p-type and n-type layers of the tunnel junction.

It is yet another objective of the present invention to reduce internal optical loss. The optical internal loss due to free-carrier optical absorption by the p-type layer of the tunnel junction is minimized by reducing its thickness. The DBR mirror reflectivity is designed to be an optimum value for specific optical internal loss in order to realize both low $g_{th}$ and high DQE.

DETAILED DESCRIPTION OF THE INVENTION

Figure 1:
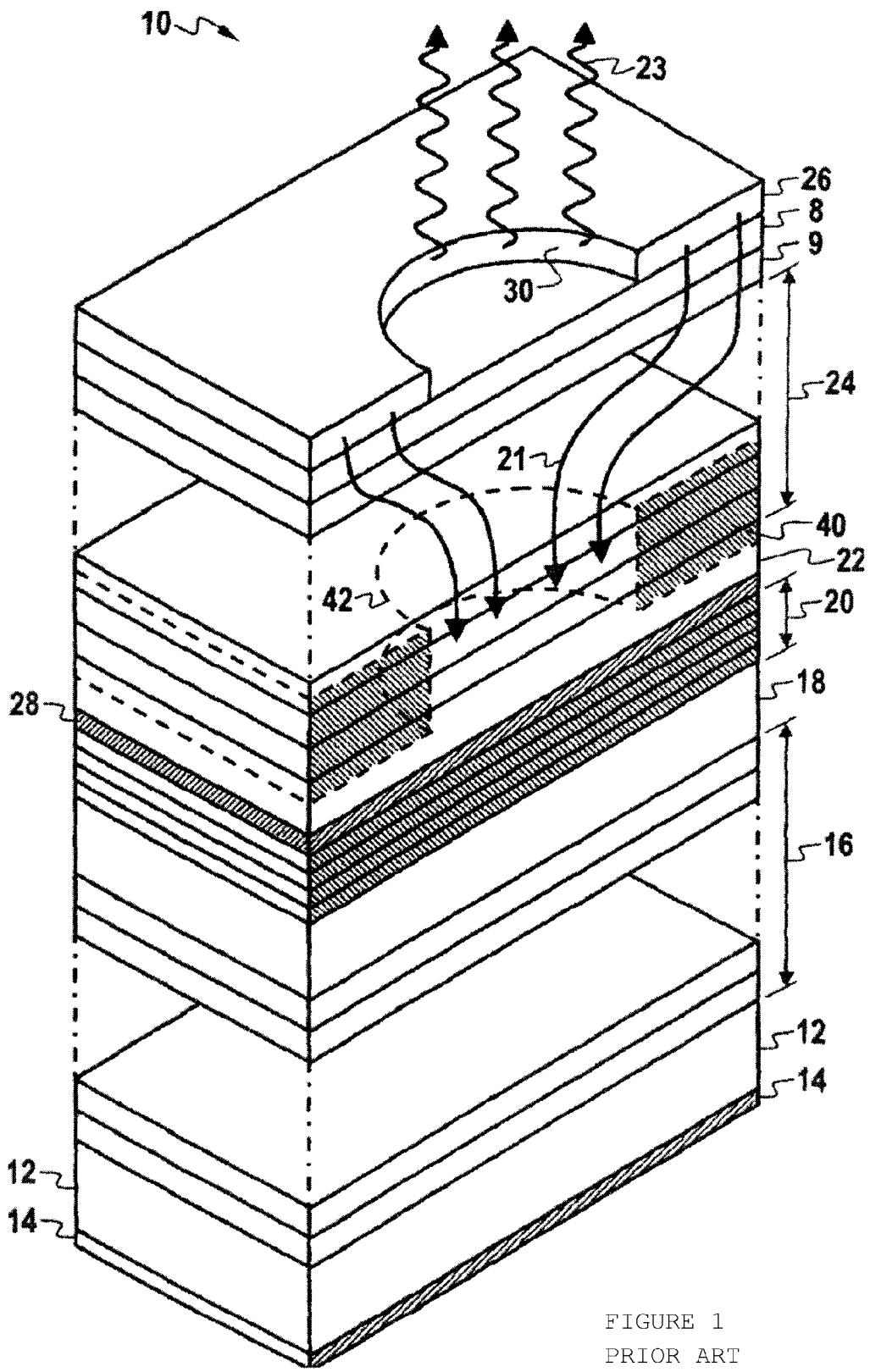
FIG. 1 is a VCSEL of the prior art.
Figure 2:
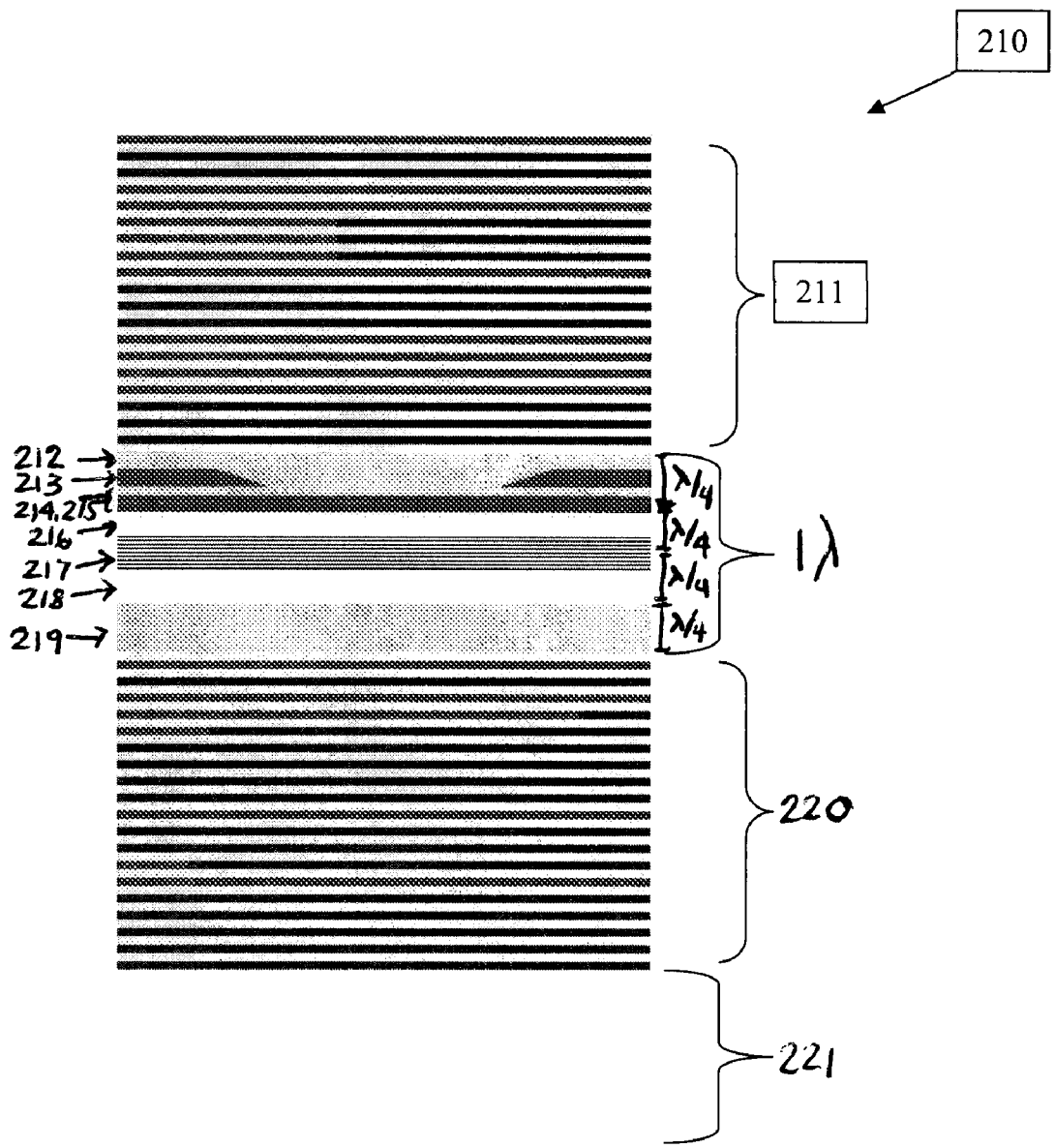
FIG. 2 is the improved VCSEL according to the present invention

An exemplary embodiment of a VCSEL, also called coherent light generators, for low power high speed optical interconnect emitting at the wavelength of around 980 nm is shown in FIG. 2. This embodiment is for illustration purposes only. The present invention is not limited this embodiment as those skilled in the art will recognize the layers may be modified from those shown with departing from the spirit of the invention. Further, the wavelength is not limited to 980 nm, and can be applied to 850 nm or even longer wavelength over 1000 nm. The present invention may be modified to operate at any wavelength including UV, visible and IR. The following discussion is made in reference to FIG. 2.

Top (DBR1) 211 and bottom (DBR2) 220 are preferably comprised of alternating $Al_{0.85}Ga_{0.15}As$ and GaAs layers. Their reflectivity is $R_1$ and $R_2$, respectively. One-lambda (wavelength, i.e. 980 nm in this case) thick optical cavity is located between the 211 and 220. Lambda/4 thick upper and lower $Al_{0.3}Ga_{0.7}As$ clad layers are preferred, i.e. upper and lower Clad1 (218 and 219), are located next to the DBR1 211 and DBR2 220, respectively. A tunnel junction 214-215 preferably comprises <10 nm-thick, heavily doped (>1.0×10$^{19}$cm$^{-3}$) p-type and n-type $In_{0.2}Ga_{0.8}As$ layers is located at the bottom of the upper Clad1 212. At this location of the tunnel junction 214-215, there is no standing wave of laser radiation so that the optical absorption due to the tunnel junction is prevented. The thickness <10 nm of the p-type and n-type layers of the tunnel junction 214-215 further suppresses the optical absorption. This tunnel junction enables the DBR1 211, DBR2 220 and both the upper and lower Clad1 218-219 to be n-type doped and their doping density below 5.0×10$^{17}$cm$^{-3}$. This reduces the optical absorption without increasing $R_S$. The reduced optical absorption results in low internal loss of the VCSEL 210. An oxide aperture 213, formed by oxidizing Al-rich, preferably Al content >90%, AlGaAs, is located within the n-type upper Clad1 212. Current flow is confined by the oxide aperture 213, and the n-type Clad1 212 enables the current confinement without increasing electrical resistance in lateral direction at the aperture, which is the case for conventional VCSELs with oxide apertures in p-type clad layers. $R=\sqrt{(R_1 R_2)}$ is designed to be between 99.6% and 99.9% in order to realize $g_{th}$<1000 cm$^{-1}$ and DQE>50% at the same time. Further increases of R decreases the DQE and lower R results in reduced $g_{th}$. The VCSEL 210 with the structure described above realizes $g_{th}$<1000 cm$^{-1}$, DQE>50%, and $R_S$<100 Ω simultaneously and hence realizes an optical interconnect transmitter operating at 15 Gbps and above with the OMA of over −1 dBm and power dissipation of less than 10 mW.

The novelty of the present invention may be summarized as follows in the list below:
  Low electrical, especially lateral, resistance provided by
    Oxide aperture in n-type clad (Upper Clad1)
  Minimized optical absorption due to p-type layer enabled by
    No p-type layer in VCSEL except in tunnel junction
    Tunnel junction p-type and n-type layer thickness: <10 nm each
    Tunnel junction located at standing-wave null: lambda/4 away from bottom of DBR1
  Further reduction of optical absorption by switching p-type layers to n-type and each parts of the VCSEL satisfying
    Upper/Lower Clad1: n-type and doping density <5.0×10$^{17}$ cm$^{-3}$
    Upper/Lower Clad2: undoped
    DBR1&2: n-type and doping density <5.0×10$^{17}$ cm$^{-3}$
    Realize both low gth and high DQE with the DBR mirror reflectivity R satisfying the following condition, $$99.6\% < R = \sqrt{(R1R2)} < 99.9\%$$

One non-limiting example of materials for each layer is:
DBR1 (High refractive index): GaAs
DBR1 (Low refractive index): Al0.85GA0.15As
Upper Clad1: Al0.3Ga0.7As
Tunnel junction n-type: In0.2Ga0.8As
Tunnel junction p-type: In0.2Ga0.8As
Upper Clad2: Al0.3Ga0.7As Quantum Well (Well): In0.2Ga0.8As
Quantum Well (Barrier): GaAs
Lower Clad2: Al0.3Ga0.7As
Lower Clad1: Al0.3Ga0.7As
DBR2 (High refractive index): GaAs
DBR2 (Low refractive index): Al0.85Ga0.15As The above list of material layers for the VCSEL 210 is for exemplary purposes only. For example, the DBR1 layers may be any combination of GaAs or AlGaAs. The upper and lower clads 1 or 2 may be any combination of AlGaAs. The tunnel junction may be any combination of p-type or n-type InGaAs or any other material systems. The quantum well section may be any combination of InGaAs and the quantum barrier section may be any combination of GaAs. Those skilled in the art will recognize that the above list of materials may be modified without departing from the spirit of the present invention.

The invention has been described in detail with particular reference to certain preferred embodiments thereof, but it will be understood that variations and modifications can be effected within the spirit and scope of the invention.

PARTS LIST

- 8—Cap layer
- 9—Conduction layer
- 10—VCSEL of the prior art
- 12—n-type InP substrate
- 14—Electrical contact
- 16—Lower mirror stack
- 18—Lower spacer
- 20—Active region
- 21—Current
- 22—Top spacer
- 23—Photonic energy
- 24—Top mirror stack
- 26—N-type electrical contact
- 28—Tunnel junction
- 30—Aperture
- 42—Conductive central opening
- 210—VCSEL according to the present invention
- 211—DBR1
- 212—Upper Clad1: n-type
- 213—Oxide Aperture
- 214—Tunnel junction: n-type
- 215—Tunnel junction: p-type
- 216—Upper Clad2: undoped
- 217—Quantum Wells
- 218—Lower Clad2: undoped
- 219—Lower Clad1: n-type
- 220—DBR2
- 221—GaAs substrate

The invention claimed is:

1. A method of manufacturing a coherent light generator for a low power high speed optical link comprising:
   (a) providing a gallium based semiconductor alloy substrate;
   (b) providing a first DBR stack over the substrate;
   (c) providing a first n-type clad layer of AlGaAs over the first DBR stack;
   (d) providing an active region comprised of InGaAs having a plurality of quantum wells over the first n-type clad layer;
   (e) providing a tunnel junction having an n-type and a p-type material and a boundary over the active region so that there is a standing wave null at an operating wavelength at the n-type/p-type boundary in the tunnel junction;
   (f) providing a second n-type clad layer of AlGaAs over the tunnel junction;
   (g) providing an oxide aperture at least partially installed in the second n-type clad layer;
   (h) providing a second DBR stack over the second n-type clad of the coherent light generator, wherein the first and second DBR stack are formed of alternating layers of n-type GaAs and n-type AlGaAs.

* * * * *